United States Patent
Chen

(10) Patent No.: US 8,942,424 B2
(45) Date of Patent: Jan. 27, 2015

(54) METHOD OF OPTIMAL OUT-OF-BAND CORRECTION FOR MULTISPECTRAL REMOTE SENSING

(71) Applicant: Wei Chen, Potomac, MD (US)

(72) Inventor: Wei Chen, Potomac, MD (US)

(73) Assignee: The United States of America, as represented by The Secretary of the Navy, Washington, DC (US)

(*) Notice: Subject to any disclaimer, the term of this patent is extended or adjusted under 35 U.S.C. 154(b) by 72 days.

(21) Appl. No.: 13/949,552

(22) Filed: Jul. 24, 2013

(65) Prior Publication Data

US 2014/0029793 A1    Jan. 30, 2014

Related U.S. Application Data

(63) Continuation-in-part of application No. 13/862,539, filed on Apr. 15, 2013.

(60) Provisional application No. 61/677,189, filed on Jul. 30, 2012.

(51) Int. Cl.
*G06K 9/00* (2006.01)
*G06K 9/66* (2006.01)
*H03K 17/14* (2006.01)
*H03K 17/687* (2006.01)
*H03K 17/693* (2006.01)

(52) U.S. Cl.
CPC ............... *G06K 9/0063* (2013.01); *G06K 9/66* (2013.01); *H03K 17/145* (2013.01); *H03K 17/687* (2013.01); *H03K 17/6872* (2013.01); *H03K 17/693* (2013.01)
USPC ........................................................ 382/103

(58) Field of Classification Search
None
See application file for complete search history.

(56) References Cited

PUBLICATIONS

Gao, Bo-Cai et al., Multispectral decomposition for the removal of out-of-band effects of visible/infrared imaging radiometer suite visible and near-infrared bands, Applied Optics. Jun. 2012, pp. 4078-4086, vol. 51, No. 18. Optical Society of America, USA.

(Continued)

*Primary Examiner* — Atiba O Fitzpatrick
(74) *Attorney, Agent, or Firm* — US Naval Research Laboratory; Suresh Koshy

(57) ABSTRACT

A method of image processing. An expected band-averaged spectral radiances image vector is simulated from training hyperspectral data and at least one filter transmittance function corresponding to the at least one optical filter. A simulated measured band-averaged spectral radiances image vector is simulated from the training hyperspectral data and the at least one transmittance function. A realistic measured band-averaged spectral radiances image vector is provided from at least one optical filter. A cross-correlation matrix of the expected band-averaged spectral radiances image vector and the realistic measured band-averaged spectral radiances image vector is calculated. An auto-correlation matrix of the simulated measured band-averaged spectral radiances image vector is calculated. An optimal out-of-band transform matrix is generated by matrix-multiplying the cross-correlation matrix and an inverse of the auto-correlation matrix. A realistic recovered band-averaged spectral radiances image vector is generated by matrix-multiplying the optimal out-of-band transform matrix and the realistic measured band-averaged spectral radiances image vector, the realistic recovered band-averaged spectral radiances image vector being free of out-of-band effects.

8 Claims, 7 Drawing Sheets

(56) References Cited

PUBLICATIONS

Chen, Wei et al., A multispectral decomposition technique for the recovery of true SeaWiFS top-of-atmosphere radiances. IEEE Geoscience and Remote Sensing Letters, Mar. 2013, pp. 288-292, vol. 10, No. 2, Institute of Electrical and Electronics Engineers, USA.

Chen, Wei et al., Out-of-Band Correction for Multispectral Remote Sensing, IEEE Transactions on Geoscience and Remote Sensing, Apr. 2013, vol. 51, No. 4, Institute of Electrical and Electronics Engineers, USA.

METHOD OF OPTIMAL OUT-OF-BAND CORRECTION FOR MULTISPECTRAL REMOTE SENSING

CROSS-REFERENCE TO RELATED APPLICATIONS

The present application claims priority to U.S. Provisional Patent Application Ser. No. 61/677,189, which was filed on 30 Jul. 2012. Additionally, the present application is a continuation-in-part application of U.S. patent application Ser. No. 13/862,539, which was filed 15 Apr. 2013.

FIELD OF THE INVENTION

The invention relates generally to a method of image processing, and more particularly to a method of multispectral decomposition for the removal of out-of-band effects.

BACKGROUND OF THE INVENTION

The correction of remote sensing radiometry for ocean color applications requires a highly accurate characterization of the optical instrument performance. For example, the Visible Infrared Imager Radiometer Suite ("VIIRS") launched successfully on 28 Oct. 2011 employs a filter radiometer to remotely sense the atmosphere in 22 visible and infrared bands located in the 0.4-12.5 μm range. Products of VIIRS data are a crucial continuation for climate change study under NASA and support NOAA and DOD operational objectives.

The primary issues of VIIRS instrument are out-of-band ("OOB") response and optical crosstalk. The OOB response is defined as the ratio of integrated response outside the one percent of peak response points of a spectral band to the integrated response for the band. The OOB effect produces a radiometric bias that depends on the source of radiance being measured and it could adversely impact VIIRS product quality. In ocean color applications, accurate and consistent sensor calibration is essential. Several multispectral radiometric instruments such as SeaWiFS and VIIRS are known to exhibit significant radiance contribution from OOB spectral response.

To deal with the Sea-viewing Wide Field-of-view Sensor ("SeaWiFS") OOB effects, a methodology was developed for SeaWiFS calibration. Based on this methodology, an improved correction method to remove the spectral band effects of the SeaWiFS on the derived normalized water-leaving radiance which results in improved ocean near surface chlorophyll concentration is developed and implemented in the operational SeaWiFS data processing system. These calibration methods adjust the measured radiances to correct OOB response for ease of comparison to in situ measured multispectral radiances. The SeaWiFS correction scheme has been successfully applied to data products retrieved over case 1 ocean waters. However, the correction scheme is inherently not usable for SeaWiFS data product corrections over case 2 turbid waters or over land.

An alternative solution for recovering the in-band multispectral radiances for SeaWiFS and VIIRS instruments is developed by Chen and Gao (Chen, W., and B.-C. Gao, "A Multispectral Decomposition Technique for the Recovery of True SeaWiFS Top-of-Atmosphere Radiances", *IEEE Geosci. Rem. Sens. Lett.,* Vol 10, No 2, 10.1109/LGRS.2012.2203293, 2013, incorporated herein by reference), and Gao and Chen (Gao, B.-C., Wei Chen, "Multispectral decomposition for the removal of out-of-band effects of visible/infrared imaging radiometer suite visible and near-infrared bands", *Applied Optics,* Vol. 51, Issue 18, pp. 4078-4086, 2012, incorporated herein by reference) using the Multispectral Decomposition Transform ("MDT") method, respectively. The OOB correction by the MDT method is based on the characteristics of the multiband responses, and the same out-of-band responses for a single sensor are also detected by other multiband sensors with different spectral passbands. The information of multiband radiances recorded by multispectral radiometers distributed at different bands provides a possibility for decomposition. The MDT approach uses the decomposition principle to recover the average narrowband signals from contaminated signals using filter transmittance functions instead of the calibration methods. For an N-channel multispectral sensor, OOB effects are corrected by applying an N×N MDT matrix to the measured signals. The MDT matrixes for SeaWiFS and VIIRS instruments are also reported by Chen and Gao, and Gao and Chen, respectively.

The characteristics of the VIIRS multiband response functions indicate that wavelength intervals of the expected band-averaged (or in-band averaged) spectral radiance are usually less than the partitioned narrow-band intervals in the MDT method. For this reason, there is still some contamination in the recovered narrow-band radiances by the MDT. To address the issue and obtain a highly accurate OOB correction, an Out-of-Band Correction Transform ("OBCT") method was developed by Chen and Lucke (Chen, W., and R. Lucke, "Out-Of-Band Correction for Multispectral Remote Sensing", *IEEE Trans. Geosci. Rem. Sens.,* Vol 51, No 3, 10.1109/TGRS.2012.2208975, 2013, incorporated herein by reference). The OBCT method provides a novel approach for dealing with the VIIRS OOB effects and has a significant improvement by comparison to the MDT method.

BRIEF SUMMARY OF THE INVENTION

An embodiment of the invention includes an image processing method. Training hyperspectral data and at least one optical filter are provided. An expected band-averaged spectral radiances image vector is simulated from the training hyperspectral data and at least one filter transmittance function corresponding to the at least one optical filter. To derive an optimal linear transform matrix for the out-of-band correction, a simulated measured band-averaged spectral radiances image vector is simulated from the training hyperspectral data and the at least one transmittance function. A cost function comprising total errors between the expected band-averaged spectral radiances image vector and the simulated measured band-averaged spectral radiances image vector, and an out-of-band transform matrix parameter is provided. An optimal cost function is generated by applying a least-squares best fit to the cost function using the out-of-band transform matrix parameter to generate a linear out-of-band correction transform. A cross-correlation matrix of the simulated expected band-averaged spectral radiances image vector and the realistic measured band-averaged spectral radiances image vector is calculated. An auto-correlation matrix of the realistic measured band-averaged spectral radiances image vector is calculated. An optimal out-of-band transform matrix is generated by matrix-multiplying the cross-correlation matrix and an inverse of the auto-correlation matrix. A realistic measured band-averaged spectral radiances image vector is provided from the at least one optical filter. A realistic recovered band-averaged spectral radiances image vector is generated by matrix-multiplying the optimal out-of-band transform matrix and the realistic measured band-averaged spectral radiances image vector, the realistic recovered band-averaged spectral radiances image vector being free of out-of-band effects.

Optionally, the method further includes analyzing the realistic recovered band-averaged spectral radiances image vector and the realistic measured band-averaged spectral radiances image vector for a presence of a target, the target comprising one of a land feature and a water feature.

DETAILED DESCRIPTION OF THE INVENTION

Figure 1:
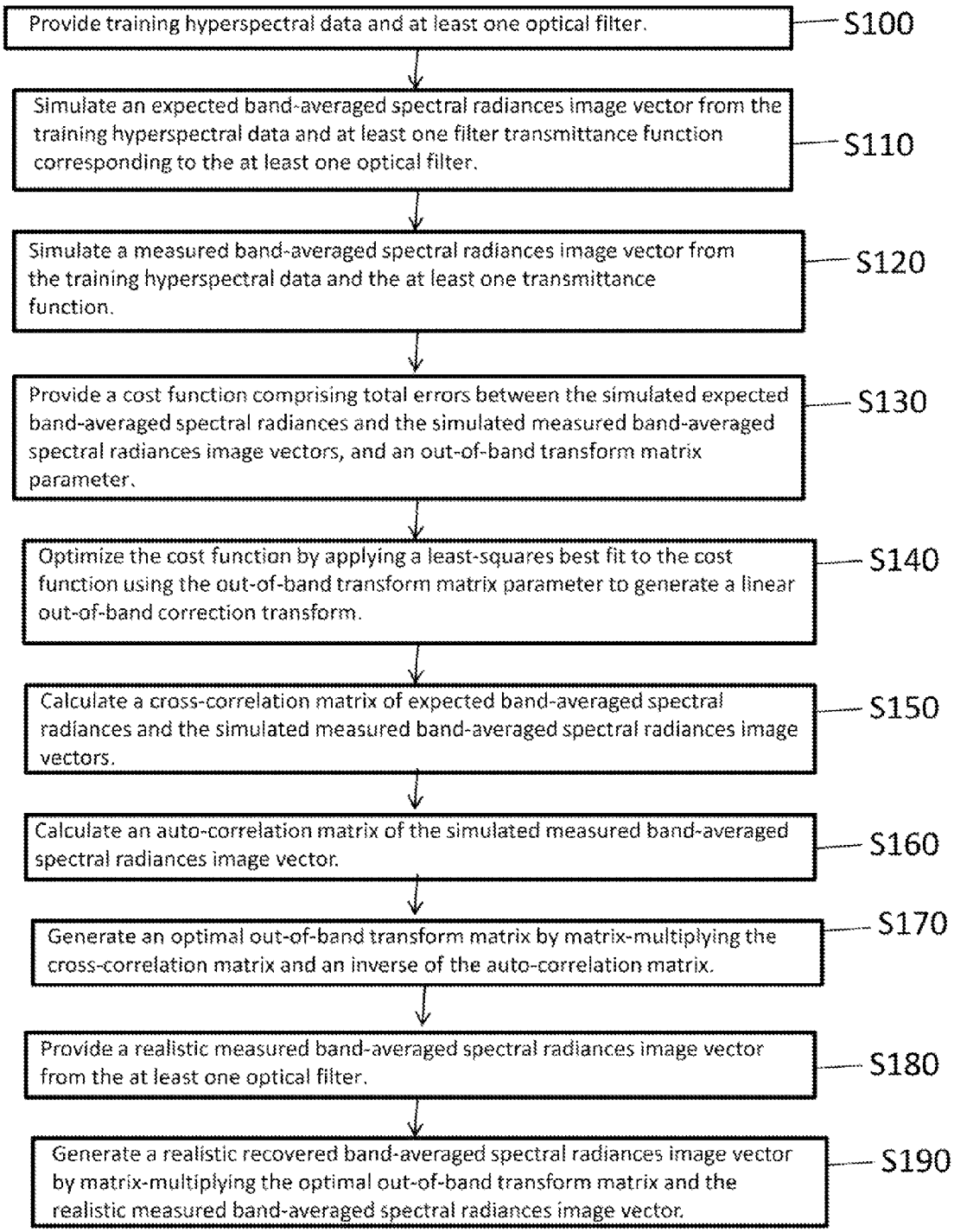
FIG. 1 is a flow chart of an illustrative method embodiment of the instant invention.
Figures 2A, 2B:
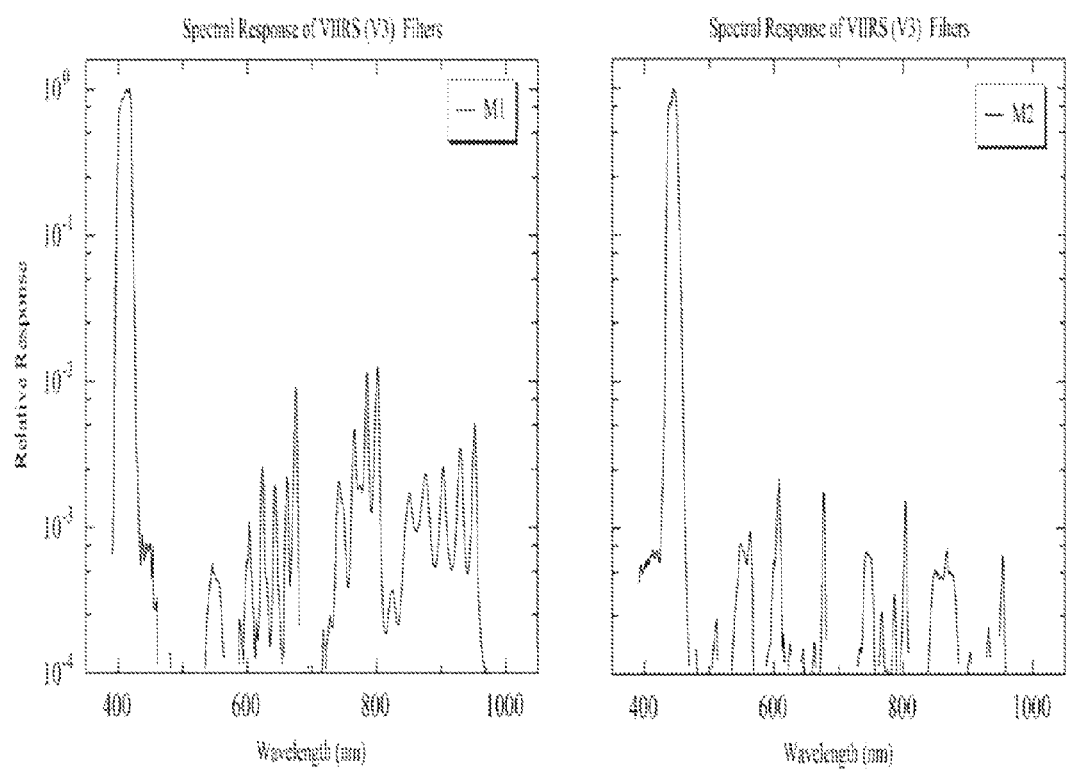
FIGS. 2A-2G are graphs of VIIRS version 3 M1-M7 filter transmittance curves, respectively, normalized at the peaks.
Figures 2C, 2D:
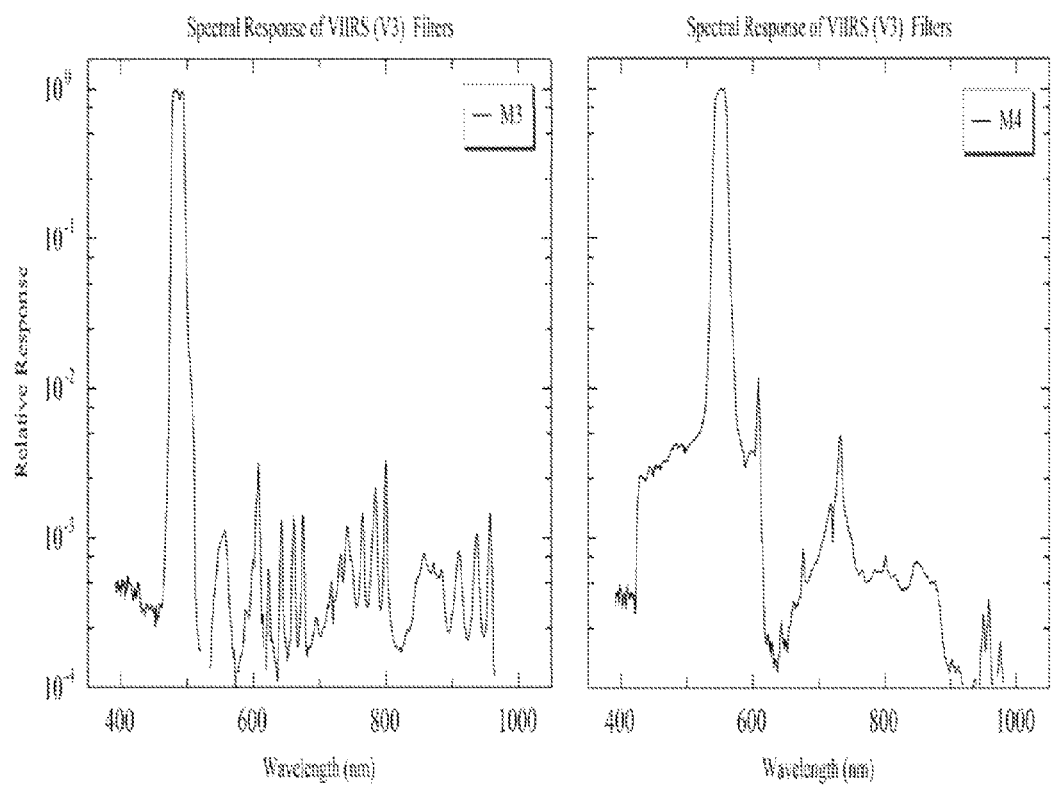
Figure 2E:
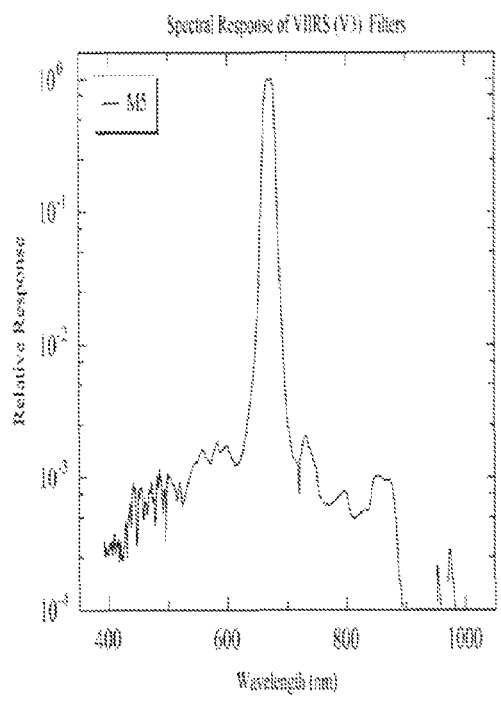
Figure 2F:
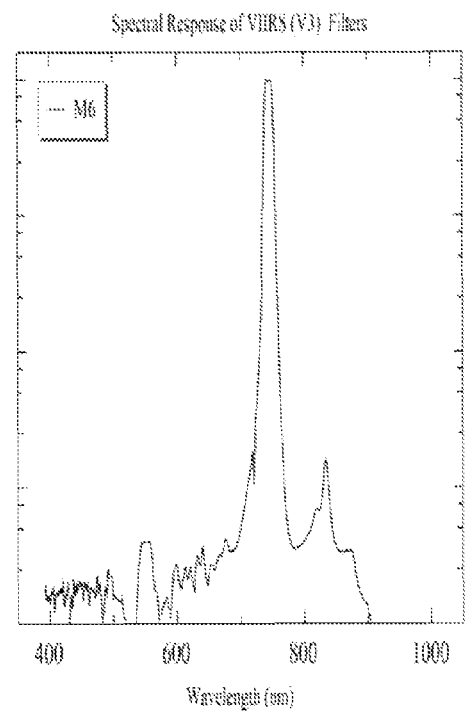
Figure 2G:
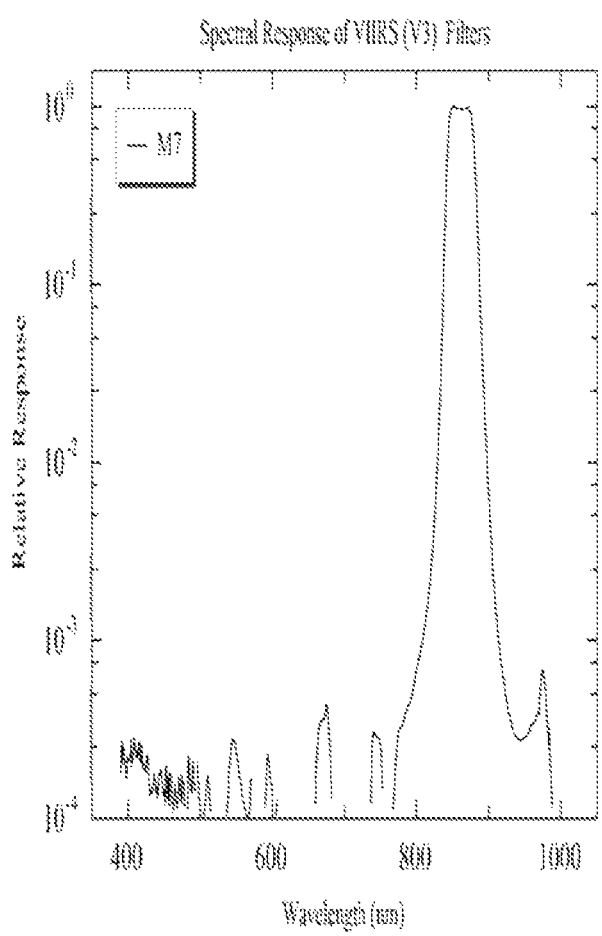

Applicant recognized that if the transform by the MDT method is a zero-order form for the OOB correction based on the band-gap treatments, then the transform by the OBCT method is a first-order form, and the MDT matrix is a special case of the OBCT matrix when the band-gaps approach zero. The linear decomposition transforms derived by the MDT and OBCT methods show two different forms, and exhibit recognizably different performances for the same VIIRS OOB correction. These results inspired applicant to consider that there may exist an optimal decomposition transform among all possible linear transforms between the measured (contaminated by the OOB effects) and recovered band-averaged spectral radiances. Applicant then sought an Optimal Out-of-Band Correction Transform ("OOBCT") to reduce the errors between the expected and realistic recovered band-averaged spectral radiances for dealing with the OOB effects.

An embodiment of the invention includes an image processing method, which is described as follows, for example, with reference to FIG. 1. Training hyperspectral data and at least one optical filter are provided, as indicated in Step S100. A simulated expected band-averaged spectral radiances image vector is simulated from the training hyperspectral data and at least one filter transmittance function corresponding to the at least one optical filter, as indicated in Step S110. For the purposes of this specification, the expected band-averaged spectral radiances image vector is an idealized (or theoretical) band-averaged spectral radiances image vector without any out-of-bound effects. A simulated measured band-averaged spectral radiances image vector is simulated from the training hyperspectral data and the at least one transmittance function, as indicated in Step S120. For the purposes of this specification, the simulated measured band-averaged spectral radiances image vector includes out-of-bound effects. A cost function comprising total errors between the simulated expected band-averaged spectral radiances image vector and the simulated measured band-averaged spectral radiances image vector, and an out-of-band transform matrix parameter based on the linear out-of-band correction transform is provided, as indicated in Step S130. An optimal cost function is generated by applying a least-squares best fit to the cost function using the out-of-band transform matrix parameter to generate a linear out-of-band correction transform, as indicated in Step S140. A cross-correlation matrix of the expected band-averaged spectral radiances image vector and the simulated measured band-averaged spectral radiances image vector is calculated, as indicated in Step S150. An auto-correlation matrix of the simulated measured band-averaged spectral radiances image vector is calculated, as indicated in Step S160. An optimal out-of-band transform matrix is generated by matrix-multiplying the cross-correlation matrix and an inverse of the auto-correlation matrix, as indicated in Step S170. A realistic measured band-averaged spectral radiances image vector is provided from the at least one optical filter, as indicated in Step S180. For the purpose of this specification, the realistic measured band-averaged spectral radiances image vector is a band-averaged spectral radiances image vector actually measured using the optical filter. A realistic recovered band-averaged spectral radiances image vector is generated by matrix-multiplying the optimal out-of-band transform matrix and the realistic measured band-averaged spectral radiances image vector, the realistic recovered band-averaged spectral radiances image vector being free of out-of-band effects, as indicated in Step S190. For the purposes of this specification, the realistic recovered band-averaged spectral radiances image vector is the linear out-of-band correction transformed version of the realistic measured band-averaged spectral radiances image vector and is free of out-of-band effects.

Optionally, the method further includes analyzing the realistic recovered band-averaged spectral radiances image vector and the realistic measured band-averaged spectral radiances image vector for a presence of a target, the target comprising one of a land feature and a water feature.

Optionally, the cost function is represented as:

$$\chi^2 = \sum_{i,j} \sum_{k=1}^{N} (s_{ijk} - \bar{s}_{ijk})^2,$$

wherein i and j go over all pixels in a $N_x \times N_y$ image (i $\in$[1, $N_x$]∩ j $\in$[1, $N_y$]) from a kth band filter of the at least one optical filter, and $s_{ijk}$ and $\bar{s}_{ijk}$ are simulated expected and simulated measured kth band-averaged spectral radiance images, respectively.

Optionally, the cross-correlation is represented as:

$$S_{\alpha\beta} = \frac{1}{N_x N_y} \sum_{i,j} s_{ij\alpha} \hat{s}_{ij\beta} = \text{corr}(s_\alpha, \hat{s}_\beta),$$

wherein i and j go over all pixels in a $N_x \times N_y$ image (i $\in$[1, $N_x$]∩ j $\in$[1, $N_y$]), and $\alpha$ and $\beta$ are row and column band indices.

Optionally, the auto-correlation is represented as:

$$\hat{S}_{\alpha\beta} = \frac{1}{N_x N_y} \sum_{i,j} \hat{s}_{ij\alpha} \hat{s}_{ij\beta} = \text{corr}(\hat{s}_\alpha, \hat{s}_\beta),$$

wherein i and j go over all pixels in a $N_x \times N_y$ image (i $\in$[1, $N_x$]∩ j $\in$[1, $N_y$]), and $\alpha$ and $\beta$ are row and column band indices.

Optionally, the at least one optical filter resides on one of an aircraft and a satellite.

Optionally, the realistic recovered band-averaged spectral radiances image vector comprises a VIIRS band-averaged spectral radiances image vector.

Optionally, the linear out-of-band correction transform is represented as:

$$\bar{s}_{ijk} = \sum_{l=1}^{N} T_{kl} \hat{s}_{ijl},$$

wherein i and j go over all pixels in a $N_x \times N_y$ image (i $\in$[1, $N_x$]∩ j $\in$[1, $N_y$]), and N is the number of filters.

Multiband Radiometric Instrument

VIIRS is a newly launched multispectral remote sensing instrument with high spectral resolution. The VIIRS VisNIR channel names and wavelengths of the nominal band centers are tabulated in the first two columns in Table 1.

TABLE 1

VIIRS VISNIR CHANNEL NAMES, POSITIONS, MINIMUM AND MAXIMUM WAVELENGTHS BETWEEN IN-BAND AND OUT-OF-BAND RESPONSES.

| VIIRS Channel | $\lambda(\mu m)$ | $\lambda_{min}^{(k)}(\mu m)$ | $\lambda_{max}^{(k)}(\mu m)$ |
|---|---|---|---|
| M1 | 0.412 | 0.395 | 0.426 |
| M2 | 0.445 | 0.432 | 0.458 |
| M3 | 0.488 | 0.473 | 0.506 |
| M4 | 0.555 | 0.530 | 0.572 |
| M5 | 0.672 | 0.649 | 0.693 |
| M6 | 0.746 | 0.731 | 0.760 |
| M7 | 0.865 | 0.830 | 0.897 |

The VIIRS filter data are available from the public domain website http://www.star.nesdis.noaa.giov/jpss/index.php. The VIIRS spectral responses with 1 nm wavelength intervals are within a wavelength range from $\lambda_{min}=0.391$ μm to $\lambda_{max}=1.001$ μm. A set of spectrally contiguous VIIRS (V3) M1-M7 filter transmittance curves (normalized at the peak of the filter transmission) is shown in FIGS. 2A-2G. It has been found that the seven channels located between 0.4 and 0.9 μm (M1-M7) in the VisNIR focal plane have problems in out-of-band responses. As can be seen in FIGS. 2A-2G, the filter curves of the VIIRS bands M1 and M4 exhibit more significant OOB transmittances than the rest of the bands.

The OOB response is defined as the ratio of the integrated response outside the 1% of peak response points (upper and lower) to the integrated response for the band. The wavelengths in the third and forth columns in Table 1 show the wavelength ranges of the in-band and OOB responses for the VIIRS instrument.

The spectral response functions shown in FIG. 1 is defined by $H_k(\lambda)$, where k is a index of the $k^{th}$ band filter and $\lambda$ is wavelength. A normalized spectral response function $h_k(\lambda)$ between the full range of the $\lambda_{min}$ and $\lambda_{max}$ is given by $$h_k(\lambda) = \frac{H_k(\lambda)}{\int_{\lambda_{min}}^{\lambda_{max}} H_k(\lambda) d\lambda}. \quad (1)$$

Band-Averaged Spectral Radiance

The measured radiance at the sensor is an average value of the spectral response with the $k^{th}$ band filter. This system is linear because the measured band-averaged spectral radiance $\hat{s}_k = \hat{s}_{ijk}$ (for a compact notation) on a pixel, where i and j are pixel indexes, from a sensor with the $k^{th}$ band filter can be expressed by $$\hat{s}_k = \int_{\lambda_{min}}^{\lambda_{max}} h_k(\lambda) s(\lambda) d\lambda, \quad (2)$$

where $\hat{s}_k$ and $s(\lambda)$ are a measured (uncorrected) and original radiances, respectively. The full range integral in (2) between $\lambda_{min}$ and $\lambda_{max}$ indicates that the measured band-averaged spectral radiance $\hat{s}_k$ consists of two contributions: in-band averaged and contaminated OOB signals. The in-band averaged spectral radiance $s_k = s_{ijk}$ on a pixel between the wavelengths $\lambda_{min}^{(k)}$ and $\lambda_{max}^{(k)}$ in Table 1 is given by $$s_k = \frac{\int_{\lambda_{min}^{(k)}}^{\lambda_{max}^{(k)}} H_k(\lambda) s(\lambda) d\lambda}{\int_{\lambda_{min}^{(k)}}^{\lambda_{max}^{(k)}} H_k(\lambda) d\lambda}. \quad (3)$$

The in-band averaged spectral radiance is a band-averaged spectral radiance without the OOB effects. This in-band averaged spectral radiance $s_k$ is the expected recovered signal from the contaminated signal $\hat{s}_k$.

The integrals for computing the measured radiance and in-band averaged spectral radiance in (2) and (3) can be approximately evaluated by summations with 1 nm wavelength resolution of the spectral radiances and responses. The summations are given by $$\hat{S}_k = \sum_{p=0}^{\lambda_{min}-\lambda_{max}} h_k(\lambda_{min}+p) s(\lambda_{min}+p), \quad (4)$$

and $$S_k = \frac{\sum_{q=0}^{\lambda_{max}^{(k)}-\lambda_{min}^{(k)}} H_k(\lambda_{min}^{(k)}+q) s(\lambda_{min}^{(k)}+q)}{\sum_{q=0}^{\lambda_{max}^{(k)}-\lambda_{min}^{(k)}} H_k(\lambda_{min}^{(k)}+q)}, \quad (5)$$

where the following property is utilized:

$$\sum_{p=0}^{\lambda_{max}-\lambda_{min}} h_k(\lambda_{min}+p) = 1.$$

Optimal Out-of-Band Correction Transform

An OOB correction can be performed using the MDT (Chen and Gao, or Gao and Chen, both cited above) method or the OBCT (Chen and Lucke, cited above) method. The in-band averaged spectral radiance for all pixels can be recovered by an OOB correction transform $T_{kl}$ such as $$\bar{s}_k = \sum_{l=1}^{N} T_{kl} \hat{s}_l, \quad (6)$$

where $\bar{s}_k = \bar{s}_{ijk}$ is the realistic recovered band averaged spectral radiance on a pixel, and N is the number of multispectral bands for a particular instrument. The transform matrix in (6) for the OOB correction can be determined by the response functions that are dependent on the characteristics of the filters for a particular instrument and parameters of the multiple band partition (Chen and Gao, or Gao and Chen, both cited above), or in-band and band-gap partitions (Chen and Lucke, cited above). A real multispectral radiance image may contain the impact of random and spatial structured noise in the scene. All the noises within the narrowband regions remain in the image recovered by the transform.

Applicant sought an optimal transform among all possible linear transforms for the OOB correction so that the errors between the expected and realistic recovered in-band averaged spectral radiances approach a minimum for all bands and pixels. Using the least-squares principle, a cost function is given by $$\chi^2 = \sum_{i,j} \sum_{k=1}^{N} (s_{ijk} - \hat{s}_{ijk})^2,$$

where i and j go over all pixels in a $N_x \times N_y$ image (i ∈ [1, $N_x$] ∩ j ∈ [1, $N_y$]). Substituting the $\bar{s}_{ijk}$ in (6) into the cost function and minimizing it with respect to all elements $T_{\alpha\beta}$ of the transform matrix, yields $$\sum_{i,j} s_{ij\alpha} \hat{s}_{ij\beta} = \sum_{l=1}^{N} T_{\alpha l} \sum_{i,j} \hat{s}_{ijl} \hat{s}_{ij\beta},$$

or a matrix form $$S = T\hat{S}, \quad (7)$$

where matrixes $S=(S_{\alpha\beta})$ and $\hat{S}=(\hat{S}_{\alpha\beta})$, and $\alpha$ and $\beta$ are row and column indices, respectively. The elements of the matrixes $S$ and $\hat{S}$ can be expressed by a correlation function, respectively, e.g.

$$S_{\alpha\beta} = \frac{1}{N_x N_y} \sum_{i,j} s_{ij\alpha} \hat{s}_{ij\beta} = \text{corr}(s_\alpha, \hat{s}_\beta),$$

and $$\hat{S}_{\alpha\beta} = \frac{1}{N_x N_y} \sum_{i,j} \hat{s}_{ij\alpha} \hat{s}_{ij\beta} = \text{corr}(\hat{s}_\alpha, \hat{s}_\beta).$$

It is clear that the Optimal Out-of-Band Correction Transform ("OOBCT") can be solved from equation (7) and it is given by $$T = S\hat{S}^{-1}, \quad (8)$$

A matrix form of equation (6) for recovering the band-averaged spectral radiance from the measured radiance is given by $$\bar{s} = T\tilde{s}, \quad (9)$$

where $\bar{s} = \bar{s}_{ij} = (\bar{s}_k)$ and $\hat{s} = \hat{s}_{ij} = (\hat{s}_k)$ are column vectors on each pixel, respectively.

The OOBCT matrix is a function of the cross-correlations and auto-correlations between two bands. To recover the in-band averaged spectral radiance, the MDT (Chen and Gao, or Gao and Chen, both cited above) and the OBCT (Chen and Lucke, cited above) matrixes for dealing with the OOB effects are derived based on the spectral response functions and the partition methodologies. The OOBCT matrix with equations (4) and (5) depends on the spectral response functions for a particular instrument through the cross-correlation and auto-correlation functions.

VIIRS OOBCT Matrix

The computation of the OOBCT matrix for the VIIRS optical instrument is discussed as follows. To evaluate the cross-correlation and auto-correlation between the two bands in (7), the measured radiance and expected band-averaged spectral radiance must be known. Using equations (4) and (5) and a real measured hyperspectral image dataset, the measured radiances and expected band-averaged spectral radiances can be obtained by a simulation method, such as discussed in Chen and Gao; Gao and Chen; and Chen and Lucke, all cited above.

The zero-order and first-order transforms can be calculated based only on the filter transmittance functions and partition parameters. The OOBCT matrix is a function of both the response functions and the measured signals. To find a transform in a variety of applications, the OOBCT matrix calculated by a specific dataset with minimized errors should be statistically optimized for other datasets. For a specific optical system such as VIIRS instrument, the computation of the OOBCT matrix is a system training process before the procedure of the VIIRS OOB correction is operated. If types of spectra in the employed hyperspectral image dataset are rich enough, the minimized OOBCT for a particular dataset is optimized for other measured or simulation multispectral datasets. The training dataset must cover all matters of interest and typical spectra such as deep water, turbid water, land, and vegetation.

The Airborne Visible InfraRed Imaging Spectrometer ("AVIRIS") is used extensively for Earth Remote Sensing. It is a unique optical sensor that delivers calibrated images of the upwelling spectral radiance in 224 contiguous spectral bands with wavelengths from 370 to 2500 nanometers (nm). The HICO™ sensor is the first hyperspectral imager designed specifically for remote sensing of the coastal environment from the International Space Station ("ISS"). It has 128 narrow channels (5.7 nm wide) covering the contiguous spectral range between 350-1080 nm with a spatial resolution of 100 m. AVIRIS and HICO data are used to simulate VIIRS data, with and without OOB effects, using the VIIRS (V3) filter transmittance functions in FIGS. 2A-2G and wavelength in-band intervals in Table 1.

Figure 3A:
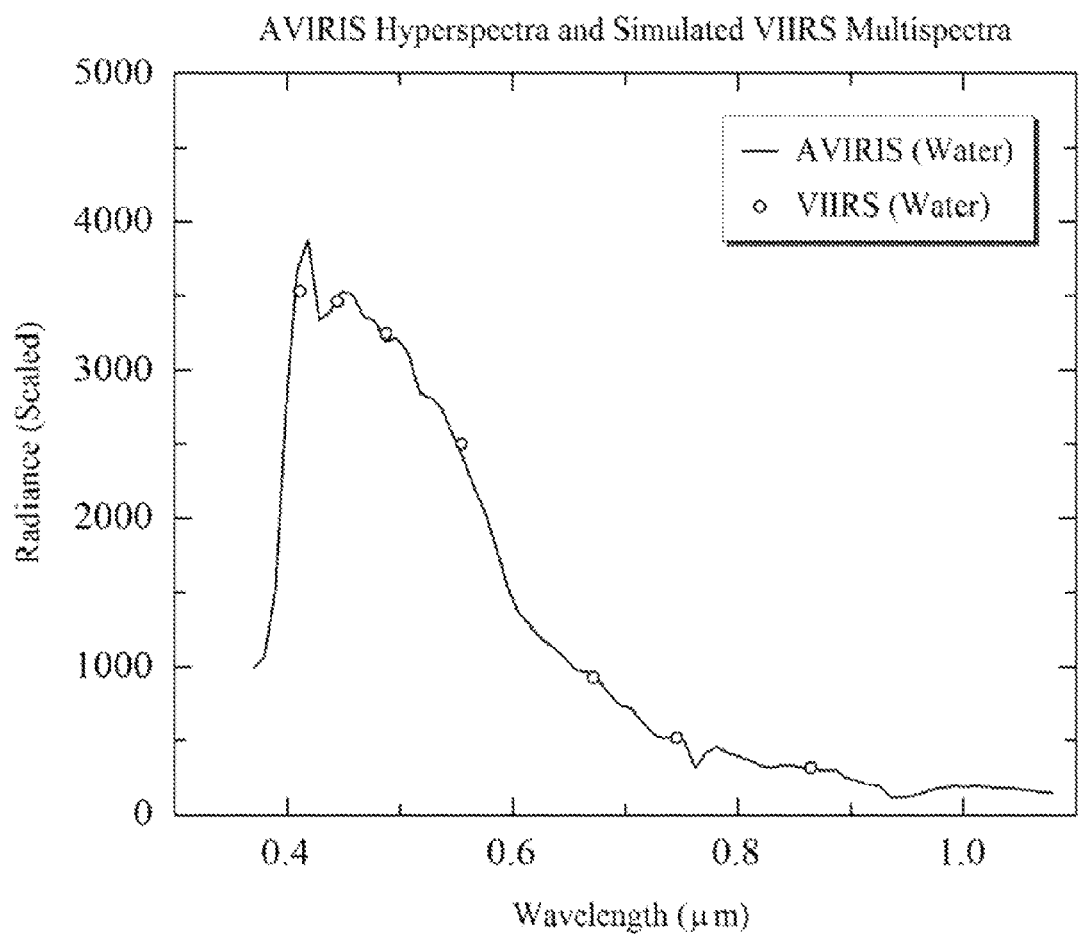
FIGS. 3A and 3B are graphs showing AVIRIS hyperspectra data and simulated VIIRS multispectra data, respectively.
Figure 3B:
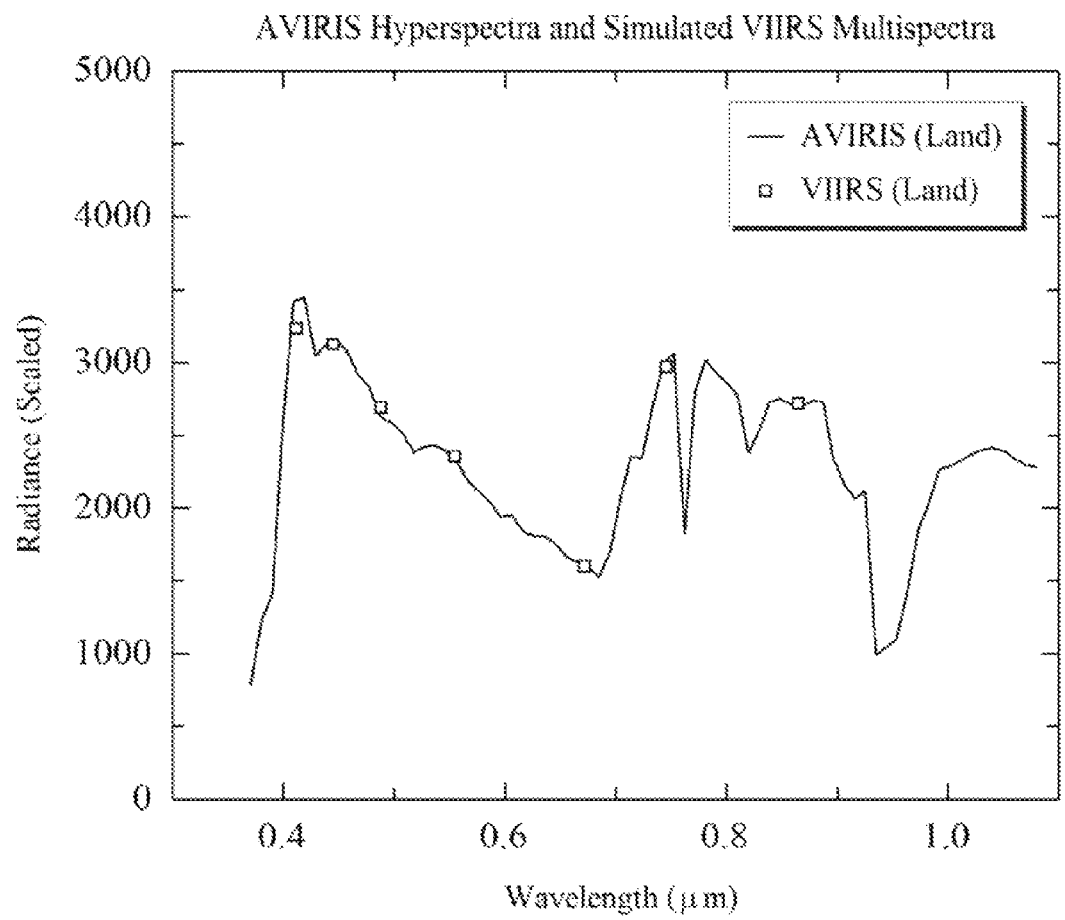

By way of example, the multispectral simulation images with and without the OOB response are synthesized by equation (4) and (5) where $s(\lambda)$ is supplied by either AVIRIS or HICO hyperspectral image data. For instance, two AVIRIS and one HICO datasets with 512×2000 resolution are chosen for the training process and experimental test data. Continuing with this example, the function $s(\lambda)$ with 1 nm resolution is obtained by a interpolation between two nearest hyperspectral bands from the AVIRIS and HICO datasets. The dataset of the AVIRIS Kennedy Space Center is employed as the training data for the computation of the OOBCT matrix. Two illustrative radiance spectra over areas covered by clear water and land in the AVIRIS Kennedy Space Center image are shown in FIGS. 3A and 3B.

The VIIRS OOBCT (7×7) matrix T based on equations (8), (4) and (5), the transmittance functions of the filters in FIG. 1, in-band wavelength intervals in Table 1, and the training dataset for the above example is given by $$\begin{pmatrix} 1.02768 & -1.6661\times10^{-3} & 2.64793\times10^{-3} & -2.98118\times10^{-3} & -4.24795\times10^{-3} & -7.69417\times10^{-3} & -1.08355\times10^{-3} \\ -2.00174\times10^{-3} & 1.00942 & 1.03182\times10^{-3} & -2.81024\times10^{-3} & -1.68048\times10^{-3} & -1.51738\times10^{-3} & -1.94131\times10^{-3} \\ -1.41508\times10^{-3} & -1.18287\times10^{-3} & 1.01633 & -3.57091\times10^{-3} & -2.5958\times10^{-3} & -2.99115\times10^{-3} & -3.41263\times10^{-3} \\ -2.51098\times10^{-3} & 6.65125\times10^{-3} & -3.80949\times10^{-3} & 1.02722 & -6.81836\times10^{-3} & -5.60123\times10^{-3} & -6.5984\times10^{-4} \\ -2.60251\times10^{-3} & -2.84681\times10^{-3} & 6.27085\times10^{-3} & -1.11028\times10^{-3} & 1.0187 & -6.07998\times10^{-3} & -1.29292\times10^{-3} \\ -1.57124\times10^{-3} & -1.06805\times10^{-4} & 1.35511\times10^{-3} & -2.31164\times10^{-3} & -3.24525\times10^{-3} & 1.00940 & -1.97605\times10^{-3} \\ -4.51680\times10^{-3} & 3.16511\times10^{-5} & 3.12846\times10^{-5} & -3.75632\times10^{-4} & -3.10573\times10^{-4} & -5.89512\times10^{-4} & 1.00246 \end{pmatrix}$$

All none main diagonal elements in the VIIRS OOBCT matrix are the OOB correction terms, and main diagonal elements are greater than but close to one. The first and fourth main diagonal elements with larger correction amounts (relative errors <2.8%) in the OOBCT matrix correspond to poor filters such as band 1 and 4 as shown in FIGS. 2A-2G.

An embodiment of the invention comprises a computer program for image processing, which computer program embodies the functions, filters, or subsystems described herein. However, it should be apparent that there could be many different ways of implementing the invention in computer programming, and the invention should not be construed as limited to any one set of computer program instructions. Further, a skilled programmer would be able to write such a computer program to implement an exemplary embodiment based on the appended diagrams and associated description in the application text. Therefore, disclosure of a particular set of program code instructions is not considered necessary for an adequate understanding of how to make and use the invention. The inventive functionality of the claimed computer program will be explained in more detail in the following description read in conjunction with the figures illustrating the program flow.

One of ordinary skill in the art will recognize that the methods, systems, and control laws discussed above with respect to image processing may be implemented in software as software modules or instructions, in hardware (e.g., a standard field-programmable gate array ("FPGA") or a standard application-specific integrated circuit ("ASIC"), or in a combination of software and hardware. The methods, systems, and control laws described herein may be implemented on many different types of processing devices by program code comprising program instructions that are executable by one or more processors. The software program instructions may include source code, object code, machine code, or any other stored data that is operable to cause a processing system to perform methods described herein.

The methods, systems, and control laws may be provided on many different types of computer-readable media including computer storage mechanisms (e.g., CD-ROM, diskette, RAM, flash memory, computer's hard drive, etc.) that contain instructions for use in execution by a processor to perform the methods' operations and implement the systems described herein.

The computer components, software modules, functions and/or data structures described herein may be connected directly or indirectly to each other in order to allow the flow of data needed for their operations. It is also noted that software instructions or a module can be implemented for example as a subroutine unit or code, or as a software function unit of code, or as an object (as in an object-oriented paradigm), or as an applet, or in a computer script language, or as another type of computer code or firmware. The software components and/or functionality may be located on a single device or distributed across multiple devices depending upon the situation at hand.

Systems and methods disclosed herein may use data signals conveyed using networks (e.g., local area network, wide area network, internet, etc.), fiber optic medium, carrier waves, wireless networks, etc. for communication with one or more data processing devices. The data signals can carry any or all of the data disclosed herein that is provided to or from a device.

This written description sets forth the best mode of the invention and provides examples to describe the invention and to enable a person of ordinary skill in the art to make and use the invention. This written description does not limit the invention to the precise terms set forth. Thus, while the invention has been described in detail with reference to the examples set forth above, those of ordinary skill in the art may effect alterations, modifications and variations to the examples without departing from the scope of the invention.

These and other implementations are within the scope of the following claims.

What is claimed as new and desired to be protected by Letters Patent of the United States is:

1. The method comprising:
providing training hyperspectral data and at least one optical filter;
simulating expected band-averaged spectral radiances image vector from the training hyperspectral data and at least one filter transmittance function corresponding to the at least one optical filter;
simulating measured band-averaged spectral radiances image vector from the training hyperspectral data and the at least one transmittance function;
providing a cost function comprising total errors between the simulated expected band-averaged spectral radiances image vector and the simulated measured band-averaged spectral radiances image vector, and an out-of-band transform matrix parameter;
optimizing the cost function by applying a least-squares best fit to the cost function using the out-of-band transform matrix parameter to generate a linear out-of-band correction transform;
calculating a cross-correlation matrix of an expected band-averaged spectral radiances image vector and the realistic measured band-averaged spectral radiances image vector;
calculating an auto-correlation matrix of the realistic measured band-averaged spectral radiances image vector;
generating an optimal out-of-band transform matrix by matrix-multiplying the cross-correlation matrix and an inverse of the auto-correlation matrix;
providing a realistic measured band-averaged spectral radiances image vector from the at least one optical filter; and
generating a realistic recovered band-averaged spectral radiances image vector by matrix-multiplying the optimal out-of-band transform matrix and the realistic measured band-averaged spectral radiances image vector, the realistic recovered band-averaged spectral radiances image vector being free of out-of-band effects.

2. The method according to claim 1, further comprising:
analyzing the realistic recovered band-averaged spectral radiances image vector and realistic measured band-averaged spectral radiances image vector for a presence of a target, the target comprising one of a land feature and a water feature.

3. The method according to claim 1, wherein the cost function is represented as:

$$\chi^2 = \sum_{i,j} \sum_{k=1}^{N} (s_{ijk} - \hat{s}_{ijk})^2,$$

wherein i and j go over all pixels in a $N_x \times N_y$ image (i $\in$ [1, $N_x$] $\cap$ j $\in$ [1, $N_y$]) from a kth band filter of the at least one optical filter, and $s_{ijk}$ and $\bar{s}_{ijk}$ are simulated expected and simulated measured kth band-averaged spectral radiance images, respectively.

4. The method according to claim 1, wherein the cross-correlation is represented as:

$$S_{\alpha\beta} = \frac{1}{N_x N_y} \sum_{i,j} s_{ij\alpha} \hat{s}_{ij\beta} = \text{corr}(s_\alpha, \hat{s}_\beta),$$

wherein i and j go over all pixels in a $N_x \times N_y$ image (i $\in$ [1, $N_x$] $\cap$ j $\in$ [1, $N_y$]), and $\alpha$ and $\beta$ are row and column band indices.

5. The method according to claim 1, wherein the auto-correlation is represented as:

$$\hat{S}_{\alpha\beta} = \frac{1}{N_x N_y} \sum_{i,j} \hat{s}_{ij\alpha} \hat{s}_{ij\beta} = \text{corr}(\hat{s}_\alpha, \hat{s}_\beta),$$

wherein i and j go overall pixels in a $N_x \times N_y$ image ($i \in [1, N_x] \cap j \in [1, N_y]$), and $\alpha$ and $\beta$ are row and column band indices.

6. The method according to claim 1, wherein the at least one optical filter resides on one of an aircraft and a satellite.

7. The method according to claim 1, wherein the recovered band-averaged spectral radiances image vector comprises a VIIRS band-averaged spectral radiances image vector.

8. The method according to claim 1, wherein the linear out-of-band correction transform is represented as:

$$\overline{s}_{ijk} = \sum_{i=1}^{N} T_{kl} \hat{s}_{ijl},$$

wherein i and j go over all pixels in a $N_x \times N_y$ image ($i \in [1, N_x] \cap j \in [1, N_y]$), and N is the number of filters.

* * * * *